(12) United States Patent
Jung et al.

(10) Patent No.: US 12,335,424 B2
(45) Date of Patent: Jun. 17, 2025

(54) ELECTRONIC DEVICE INCLUDING FOLDABLE DISPLAY

(71) Applicant: Samsung Electronics Co., Ltd., Gyeonggi-do (KR)

(72) Inventors: Dongkee Jung, Gyeonggi-do (KR); Kyuhwan Lee, Gyeonggi-do (KR); Haejin Lee, Gyeonggi-do (KR); Juhee Han, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 315 days.

(21) Appl. No.: 18/110,451

(22) Filed: Feb. 16, 2023

(65) Prior Publication Data

US 2023/0199097 A1    Jun. 22, 2023

Related U.S. Application Data

(63) Continuation of application No. PCT/KR2022/001051, filed on Jan. 20, 2022.

(30) Foreign Application Priority Data

Jan. 20, 2021    (KR) .................. 10-2021-0008232

(51) Int. Cl.
*G06F 1/20* (2006.01)
*G06F 1/16* (2006.01)
*H04M 1/02* (2006.01)

(52) U.S. Cl.
CPC ........ *H04M 1/0268* (2013.01); *G06F 1/1641* (2013.01); *G06F 1/1652* (2013.01);
(Continued)

(58) Field of Classification Search
CPC ............. H04M 1/0268; H04M 1/0216; H04M 1/0214; G06F 1/1641; G06F 1/1652;
(Continued)

(56) References Cited

U.S. PATENT DOCUMENTS 9,354,476 B2 *   5/2016   Han ..................... G06F 1/1616
10,488,898 B2   11/2019   Shah
(Continued)

FOREIGN PATENT DOCUMENTS

CN        110796955 B      12/2021
KR   10-2018-0002047 A      1/2018
(Continued)

OTHER PUBLICATIONS

European Search Report dated Feb. 14, 2024.
Notice of Patent Grant dated Jun. 21, 2023.

*Primary Examiner* — Anthony M Haughton
*Assistant Examiner* — Theron S Milliser
(74) *Attorney, Agent, or Firm* — Cha & Reiter, LLC

(57) ABSTRACT

According to various embodiments of the present disclosure, an electronic device may include a first housing, a second housing connected to the first housing via a hinge structure, an electronic component, a flexible display being configured to be foldable according to rotation, a heat dissipation sheet arranged under the flexible display, and a first adhesive layer configured to bond the flexible display and the heat dissipation sheet to each other. The heat dissipation sheet may include a first portion corresponding to the first housing, a second portion corresponding to the second housing, and a third portion interconnecting the first portion and the second portion and corresponding to the hinge structure. The third portion may include a structure that protrudes or is folded at least once with respect to the first portion and the second portion. The first adhesive layer may include a first opening corresponding to the third portion.

20 Claims, 11 Drawing Sheets

(52) U.S. Cl.
CPC ............ *G06F 1/1681* (2013.01); *G06F 1/203* (2013.01); *H04M 1/0216* (2013.01)

(58) Field of Classification Search
CPC ... G06F 1/1681; G06F 1/203; H05K 7/20472; G09F 9/301
See application file for complete search history.

(56) References Cited

U.S. PATENT DOCUMENTS

| | | | |
|---|---|---|---|
| 10,770,676 B2 | 9/2020 | Oh et al. | |
| 11,245,782 B2 | 2/2022 | Hong | |
| 11,294,429 B2 | 4/2022 | Oh et al. | |
| 11,327,533 B2 | 5/2022 | Wang et al. | |
| 11,406,044 B2 * | 8/2022 | Wu | G06F 1/1616 |
| 11,556,021 B2 * | 1/2023 | Hirakata | H04M 1/0268 |
| 11,662,615 B2 * | 5/2023 | Hirakata | G09F 9/301 349/58 |
| 11,815,947 B2 * | 11/2023 | Lee | G06F 1/1616 |
| 11,899,297 B2 * | 2/2024 | Hirakata | G09F 9/301 |
| 11,963,336 B2 * | 4/2024 | Wu | F28F 3/02 |
| 12,117,871 B2 * | 10/2024 | Yuan | G06F 1/1616 |
| 2017/0292053 A1 * | 10/2017 | Zaggl | F28F 1/105 |
| 2019/0063854 A1 * | 2/2019 | Yoshida | F28F 21/067 |
| 2019/0069451 A1 | 2/2019 | Myers et al. | |
| 2019/0265756 A1 * | 8/2019 | Jones | H05K 1/0306 |
| 2020/0245501 A1 * | 7/2020 | Wu | F28F 3/02 |
| 2020/0301474 A1 | 9/2020 | Yug | |
| 2020/0356143 A1 | 11/2020 | Oh et al. | |
| 2022/0294886 A1 * | 9/2022 | Seo | G09G 3/035 |

FOREIGN PATENT DOCUMENTS

| | | |
|---|---|---|
| KR | 10-2018-0062271 A | 6/2018 |
| KR | 10-2020-0027760 A | 3/2020 |
| KR | 10-2020-0070336 A | 6/2020 |
| KR | 10-2020-0077931 A | 7/2020 |
| KR | 10-2020-0108754 A | 9/2020 |
| KR | 10-2020-0129872 A | 11/2020 |
| WO | 2020/052028 A1 | 3/2020 |

* cited by examiner

ELECTRONIC DEVICE INCLUDING FOLDABLE DISPLAY

CROSS-REFERENCE TO RELATED APPLICATION(S)

This application is a continuation of International Application No. PCT/KR2022/001051, filed on Jan. 20, 2022, which is based on and claims the benefit of a Korean patent application number 10-2021-0008232, filed on Jan. 20, 2021, in the Korean Intellectual Property Office, the disclosure of which is incorporated by reference herein in its entirety.

TECHNICAL FIELD

The present disclosure relates to an electronic device including a foldable display.

BACKGROUND ART

A mobile electronic device such as a smartphone may provide various functions, such as phone calls, video playback, and Internet browsing, based on various types of applications. A user may wish to use the above-mentioned various functions via a larger screen, but as the screen becomes larger, portability of the mobile electronic device may be reduced. Accordingly, foldable electronic devices capable of increasing portability by using a folding display are increasingly commercialized. For example, the foldable electronic device may include a hinge structure and a first housing and a second housing connected in opposite directions to be rotatable relative to the hinge structure. Such a foldable electronic device may include a foldable display disposed to be arranged across the first housing and the second housing when unfolded.

In order to effectively dissipate heat generated by elements arranged inside the electronic device, in the case of the conventional bar-type electronic devices, it may be possible to attach a heat dissipation sheet to a region close to the total area of the display. However in foldable electronic devices, there is a need to provide a separate structure different from the heat dissipation structure in conventional bar-type electronic devices.

In a foldable electronic device, a variable region exists in the flexible display due to a hinge structure that allows the first housing and the second housing to be folded or unfolded. Therefore, when a non-stretchable integrated heat dissipation sheet extending across the first housing and the second housing is attached to the rear surface of the flexible display, it is difficult to perform the normal operation of folding or unfolding the flexible display. Furthermore, durability may be reduced due to the change in the length of the heat dissipation sheet arranged on the rear surface while the device is unfolded and folded. Therefore, the conventional heat dissipation structure in conventional bar-shaped electronic devices may not be suitable for foldable electronic devices.

SUMMARY

According to various embodiments of the present disclosure, an electronic device may include a first housing, a second housing connected to the first housing via a hinge structure to be rotatable relative to the first housing, an electronic component arranged in at least one region of the first housing or the second housing, a flexible display arranged in one region of the first housing and one region of the second housing, the flexible display being configured to be foldable according to rotation, a heat dissipation sheet arranged under the flexible display and configured to diffuse heat generated by the electronic component, and a first adhesive layer configured to bond the flexible display and the heat dissipation sheet to each other. The heat dissipation sheet may include a first portion corresponding to the first housing, a second portion corresponding to the second housing, and a third portion interconnecting the first portion and the second portion and corresponding to the hinge structure. The third portion may include a structure that protrudes or is folded one or more times with respect to the first portion and the second portion. The first adhesive layer may include a first opening in the region corresponding to the third portion.

An electronic device according to various embodiments may include a hinge structure extending in a rotation axis direction, a first housing connected to one side of the hinge structure in a direction perpendicular to the rotation axis of the hinge structure to rotate about the rotation axis relative to the hinge structure, a second housing connected to the other side of the hinge structure to rotate about the rotation axis relative to the hinge structure, an electronic component arranged in at least one region of the first housing or the second housing, a flexible display disposed on one region of the first housing and one region of the second housing, the flexible display being configured to be foldable according to rotation, a heat dissipation sheet arranged under the flexible display and configured to diffuse heat generated by the electronic component, and a first adhesive layer configured to bond the flexible display and the heat dissipation sheet to each other. The heat dissipation sheet may include a bending region at least a portion of which is arranged to correspond to the hinge structure and formed as a flat or curved surface, a first portion extending from the bending region to one side in a direction perpendicular to the rotation axis, and a second portion extending from the bending region to the other side in the direction perpendicular to the rotation axis. The bending region may include a structure that protrudes or is folded one or more times with respect to the first portion and the second portion, and the first adhesive layer may include a portion that does not include an adhesive material in a region corresponding to the bending region.

Certain embodiments disclosed herein may provide an electronic device capable of compensating for a change in length occurring in a variable region of its flexible display by deforming one region of the heat dissipation sheet arranged on the rear surface of the variable region of the flexible display.

According to various embodiments disclosed herein, it is possible to maintain the durability of the heat dissipation sheet arranged on the rear surface of the flexible display even when the flexible display is repeatedly folded and unfolded.

In addition, according to various embodiments disclosed herein, it is possible to maintain the durability of the heat dissipation sheet without requiring extra space in the internal space of the electronic device.

Furthermore, according to various embodiments disclosed herein, the integrated heat dissipation sheet extending cross the first housing and the second housing can obtain better heat dissipation than separate heat dissipation sheets arranged in the first housing and the second housing.

In addition, various effects directly or indirectly identified through this document may be provided.

DETAILED DESCRIPTION

Figure 1:
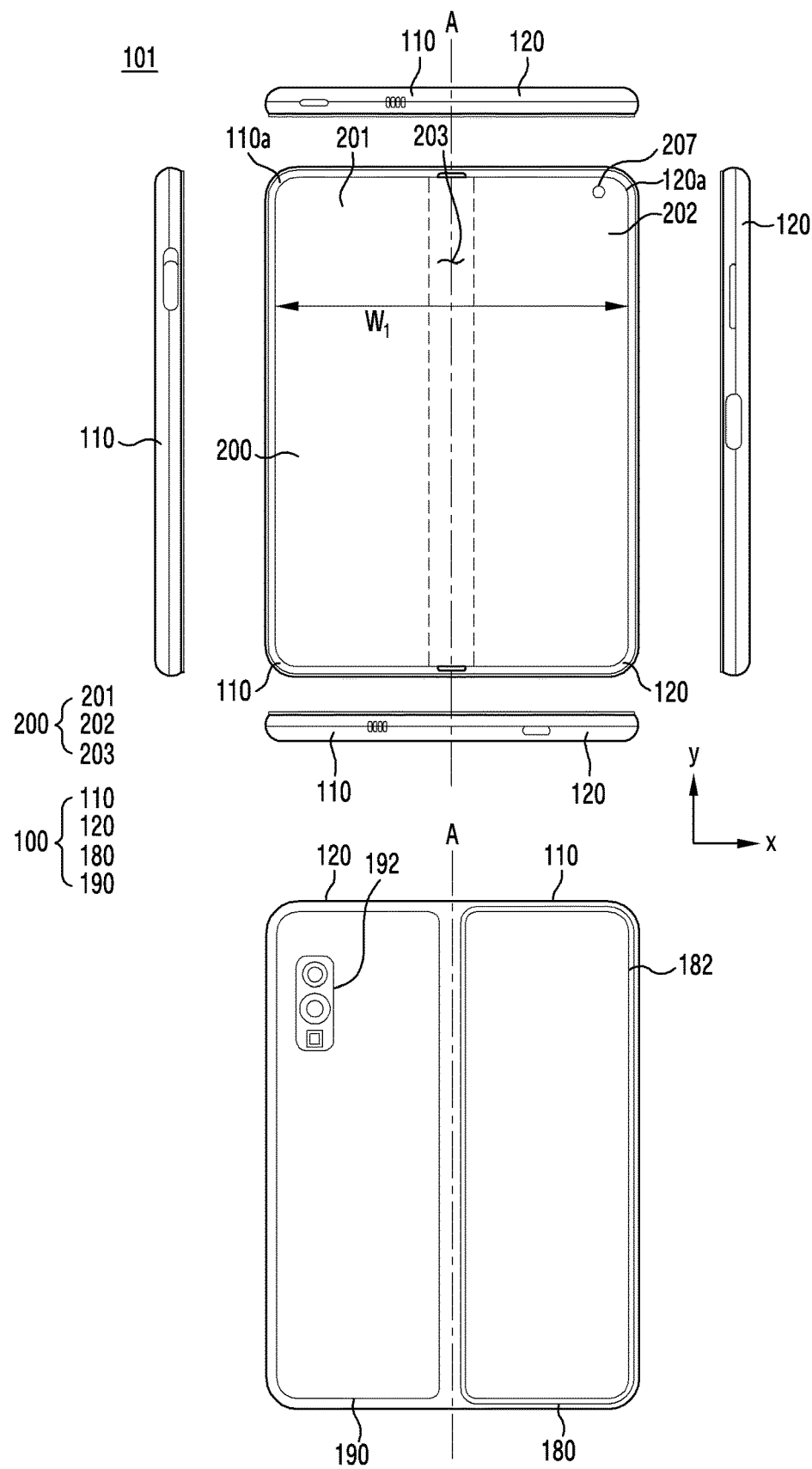
FIG. 1 is a view illustrating an unfolded status of an electronic device according to an embodiment.
Figure 2:
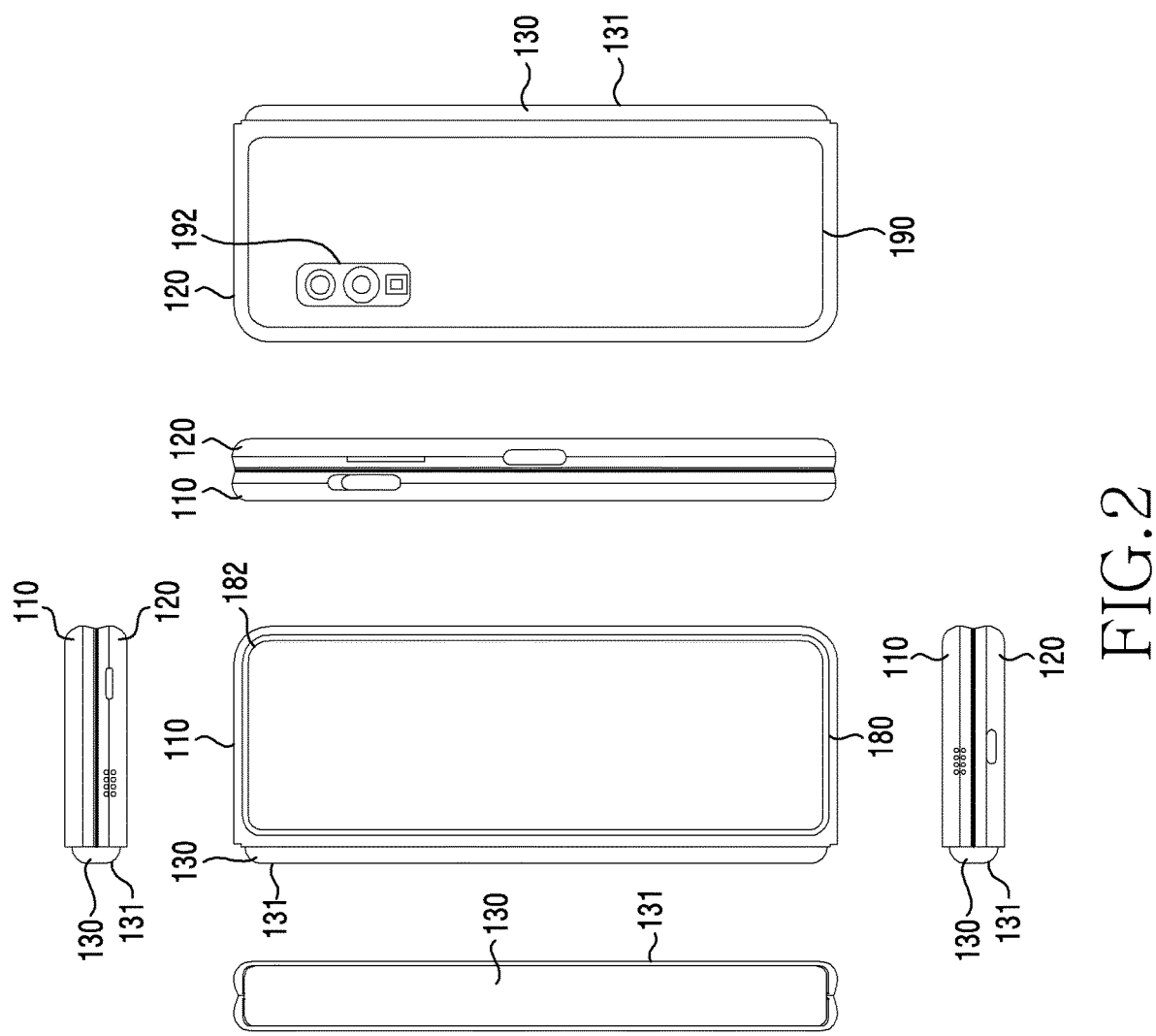
FIG. 2 is a view illustrating a folded status of the electronic device according to an embodiment.

FIG. 1 is a view illustrating an unfolded state of the electronic device 101 according to an embodiment. FIG. 2 is a diagram illustrating a folded state of the electronic device 101 according to an embodiment.

Referring to FIGS. 1 and 2, the electronic device 101 may include a foldable housing 100, a hinge structure 130, a hinge cover 131 forming an outer surface of the hinge structure 130 and covering a foldable portion of the foldable housing 100, and a flexible or foldable display 200 (hereinafter, shortened as "display") disposed in a space formed by the foldable housing 100. In an embodiment, a surface on which the display 200 is disposed (or the surface visible from the outside of the electronic device 101) may be defined as the front surface of the electronic device 101. In addition, the opposite surface of the front surface may be defined as the rear surface of the electronic device 101. In addition, the surface surrounding the space between the front surface and the rear surface may be defined as the side surface of the electronic device 101.

In an embodiment, the foldable housing 100 may include a first housing 110, a second housing 120, a first rear cover 180, a second rear cover 190, and a hinge structure 130. The foldable housing 100 of the electronic device 101 is not limited to the shapes and combinations shown in FIGS. 1 and 2, and may be implemented by other shapes or parts or combinations thereof. For example, the first housing 110 and the first rear cover 180 may be integrated in a single structure, and the second housing 120 and the second rear cover 190 may be integrated.

In an embodiment, the first housing 110 may include a first surface (e.g., the first surface 111 of FIG. 3) facing in a first direction and a second surface (112 of FIG. 3) facing in a second direction opposite to the first direction. The second housing 120 is connected to the hinge structure 130 and may rotate with respect to the first housing 110 with respect to a third surface (e.g., the third surface 121 of FIG. 3) facing in a third direction and a fourth surface 122 of FIG. 3 facing opposite to the third direction. The electronic device 101 may be changed from a folded state to an unfolded state or vice versa.

In an embodiment, the first housing 110 and the second housing 120 may be disposed on both sides of the rotation axis A, and the first housing 110 and the second housing 120 may have symmetrical shapes with respect to the rotation axis A while the foldable housing 100 is unfolded. As will be described later, angles or distances formed between the first housing 110 and the second housing 120 may vary depending on whether the electronic device 101 is in the unfolded state, the folded state, or a partially unfolded intermediate state. According to an embodiment illustrated in FIGS. 1 and 2, the second housing 120 may have a shape symmetrical to that of the first housing 110. However, the first housing 110 and the second housing 120 may have asymmetric shapes. For example, the first housing 110 may have a wider screen display area than the second housing 120. In addition, for example, in FIGS. 1 and 2, the hinge structure 130 is formed in a central area of the electronic device 101 so that the first housing 110 and the second housing 120 can be symmetrically folded, but in another embodiment, the hinge structure 130 may be formed in a non-central area of the electronic device 101 and the second housing 120 may be larger than the first housing 110.

In an embodiment, as illustrated in FIG. 1, the first housing 110 and the second housing 120 may form a recess for accommodating the display 200.

In an embodiment, the recess may have a first width w1 between the first portion 110a parallel to the rotation axis A of the first housing 110 and the second portion 120a parallel to the rotation axis A of the second housing 120.

In an embodiment, at least a portion of the first housing 110 and the second housing 120 may be made of a metal material or a non-metal material having sufficient rigidity to support the display 200. At least a part of the metal material may provide a ground plane of the electronic device 101, and may be electrically connected to a ground line formed on a printed circuit board (e.g., the substrate part 500 of FIG. 3).

In an embodiment, the first rear cover 180 may be disposed on one surface of the rotation axis A on the rear surface of the electronic device 101 and may, for example, have a substantially rectangular shape, and the edge may be wrapped by the first housing 110. Similarly, the second rear cover 190 is disposed on the other side of the rotation axis A of the rear surface of the electronic device 101, and an edge thereof may be wrapped by the second housing 120.

In an embodiment, the first rear cover 180 and the second rear cover 190 may have substantially symmetrical shapes with respect to the rotation axis A. However, the first rear cover 180 and the second rear cover 190 are not necessarily symmetrical to each other, and in another example, the first rear cover 180 may be integrated with the first housing 110, and the second rear cover 190 may be integrated with the second housing 120.

In an embodiment, the first housing 110, the second housing 120, the first rear cover 180, and the second rear cover 190 may form a space in which various components (e.g., printed circuit board or battery) of the electronic device 101 may be disposed. In an embodiment, one or more components may be disposed on the rear surface of the electronic device 101 or may be visually exposed. For example, at least a portion of the sub-display may be visually exposed through the first rear region 182 of the first rear cover 180. In another example, one or more components or sensors may be visually exposed through the second rear region 192 of the second rear cover 190. In one example, the sensor may include a proximity sensor and/or a rear camera.

In an embodiment, the front camera exposed to the front surface of the electronic device 101 through one or more openings provided in the camera hole 207 of the display 200 or the rear camera exposed through the second rear region 192 of the second rear cover 190 may include one or more lenses, an image sensor, and/or an image signal processor. The flash may include, for example, a light emitting diode or a xenon lamp. In some embodiments, two or more lenses (infrared camera, wide-angle and telephoto lens) and image sensors may be disposed on one side of electronic device 101.

Referring to FIG. 2, the hinge cover 131 may be disposed between the first housing 110 and the second housing 120 to include an internal component (e.g., hinge structure 130). In one example, the hinge cover 131 may be covered or exposed to the outside by a part of the first housing 110 and the second housing 120 depending on a state (e.g., a flat state, intermediate state, or folded state) of the electronic device 101.

In an embodiment, as illustrated in FIG. 1, when the electronic device 101 is in the unfolded state, the hinge cover 131 may not be exposed because it is covered by the first housing 110 and the second housing 120. As another example, as illustrated in FIG. 2, when the electronic device 101 is folded (e.g., a fully folded state), the hinge cover 131 may be exposed to the outside between the first housing 110 and the second housing 120. In another embodiment, when the first housing 110 and the second housing 120 form a predetermined angle, the hinge cover 131 may be partially exposed to the outside between the first housing 110 and the second housing 120. However, in this case, the exposed area may be less than the exposed area in the fully folded state. In one example, the hinge cover 131 may include a curved surface.

In an embodiment, the display 200 may be disposed in a space formed by the foldable housing 100. For example, the display 200 may be seated on a recess formed by the foldable housing 100 and may constitute most of the front surface of the electronic device 101. Accordingly, the front surface of the electronic device 101 may include the display 200 and a partial area of the first housing 110 adjacent to the display 200 and a partial area of the second housing 120. The rear surface of the electronic device 101 may include a first rear cover 180, a partial area of the first housing 110, a second housing 120, and a partial area of the second housing 120 adjacent to the second housing 120.

In an embodiment, the display 200 may be a display in which at least a partial area may be deformed into a flat surface or a curved surface. In an embodiment, the display 200 may include a first region 201 disposed on one side (e.g., the left side of the folding region 203 shown in FIG. 1) and a second region 202 disposed on the other side (e.g., the right side of the folding region 203 shown in FIG. 1) of the folding region 203. However, the region division of the display 200 shown in FIG. 1 is exemplary, and the display 200 may be divided into a plurality of regions (e.g., four or two) according to a structure or function. For example, in the embodiment illustrated in FIG. 1, the area of the display 200 may be divided by the folding area 203 extending parallel to the y-axis or the rotation axis A, but in another embodiment, the display 200 may be divided based on another folding area (e.g., a folding area parallel to the x-axis). In one configuration, the display 200 may be coupled to or adjacent to a touch sensing circuit, a pressure sensor capable of measuring the intensity (pressure) of touches, and/or a digitizer detecting a magnetic field type stylus pen.

In an embodiment, the first region 201 and the second region 202 may have a shape that is entirely symmetrical with respect to the folding region 203. In another embodiment, unlike the first region 201, the second region 202 may include a notch cut to accommodate the camera hole 207, but may have a shape symmetrical to the first region 201 in other regions. In other words, the first region 201 and the second region 202 may include symmetrical portions as well as asymmetrical portions.

Hereinafter, operations of the first housing 110 and the second housing 120 according to a state (e.g., folded state, unfolded state, or intermediate state) of the electronic device 101 and each region of the display 200 will be described.

In an embodiment, when the electronic device 101 is unfolded (e.g., FIG. 1), the first housing 110 and the second housing 120 may be disposed to face in the same direction at an angle of 180 degrees. The surface of the first region 201 and the surface of the second region 202 of the display 200 may form 180 degrees, and may face the same direction (e.g., the front direction of the electronic device 101). The folding region 203 may form the same plane as the first region 201 and the second region 202.

In an embodiment, when the electronic device 101 is folded (e.g., FIG. 2), the first housing 110 and the second housing 120 may be disposed to face each other. The surface of the first region 201 and the surface of the second region 202 of the display 200 form a narrow angle (e.g., between 0 and 10 degrees) and may face each other. At least a portion of the folding region 203 may form a curved surface having a predetermined curvature.

In an embodiment, when the electronic device 101 is in an intermediate state, the first housing 110 and the second housing 120 may be disposed at a predetermined angle. The surface of the first region 201 and the surface of the second region 202 of the display 200 may form an angle larger than the corresponding angle during the folded state. At least a part of the folding region 203 may form a curved surface having a predetermined curvature, and the curvature in this case may be smaller than that in the folded state.

According to an embodiment illustrated in FIG. 2, the first surface (e.g., the first surface 111 of FIG. 3) of the first housing 110 faces the third surface (e.g., the third surface 121 of FIG. 3) of the second housing 120 in an in-fold state.

Unlike an embodiment illustrated in FIG. 2, the second surface (e.g., the second surface 112 of FIG. 3) of the first housing 110 may face the fourth surface (e.g., the fourth surface 122 of FIG. 3) of the second housing 120 by being folded outward.

In an embodiment, the electronic device 101 may perform both the inward folding operation and the outward folding operation, or may selectively perform the inward folding operation or the outward folding operation.

Figure 3:
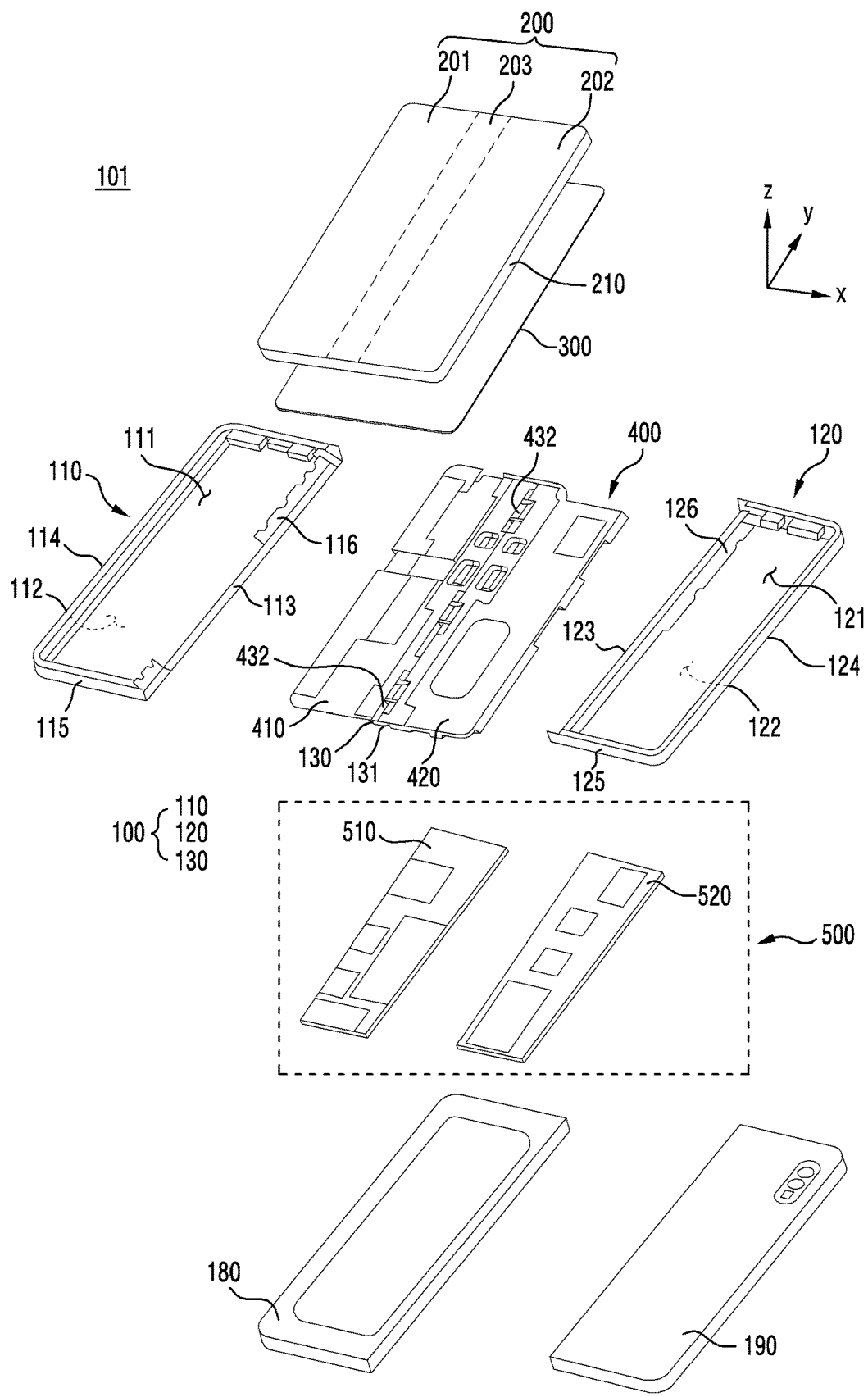
FIG. 3 is an exploded perspective view of an electronic device according to an embodiment.

FIG. 3 is an exploded perspective view of an electronic device 101 according to an embodiment.

Referring to FIG. 3, in an embodiment, the electronic device 101 may include a foldable housing 100, a display 200, and a substrate 500. The foldable housing 100 may include a first housing 110, a second housing 120, a hinge structure 130, a bracket assembly 400, a first rear cover 180, and a second rear cover 190.

In an embodiment, the display 200 may include a display panel 210 and one or more plates (e.g., a metal plate 212 of FIG. 5A to be described later) on which the display panel 210 is mounted. In one example, the heat dissipation sheet 300 may be disposed on the rear surface of the display 200. In an embodiment, the metal plate 212 may be disposed between the display panel 210 and the heat dissipation sheet 300. An adhesive layer (e.g., the first adhesive layer 250 of FIG. 5A to be described later) may be disposed between the metal plate 212 and the heat dissipation sheet 300 to adhere the metal plate 212 to the heat dissipation sheet 300.

In an embodiment, the bracket assembly 400 may include a first support plate 410 and a second support plate 420. A connection structure 432 is formed between the first support plate 410 and the second support plate 420 so that hinge or rotation operations may be freely performed, and a hinge cover 131 may cover the connection structure 432 so that it is not visible when viewed from the exterior of the electronic device 101. In another embodiment, a printed circuit board (e.g., flexible circuit board (FPC) and flexible printed circuit) may be disposed to cross the first support plate 410 and the second support plate 420.

In an embodiment, the substrate part 500 may include a first main circuit board 510 disposed on a side of the first support plate 410 and a second main circuit board 520 disposed on a side of the second support plate 420. The first main circuit board 510 and the second main circuit board 520 may be disposed inside a space formed by the bracket assembly 400, the first housing 110, the second housing 120, the first rear cover 180, and the second rear cover 190. Components for implementing various functions of the electronic device 101 (e.g. processor) may be disposed on the first main circuit board 510 and the second main circuit board 520.

In an embodiment, the first housing 110 and the second housing 120 may be assembled to be coupled to both sides of the bracket assembly 400 while the display 200 is coupled to the bracket assembly 400. For example, the first housing 110 and the second housing 120 may slide from both sides of the bracket assembly 400 (e.g. the +x and −x directions) to be coupled to the bracket assembly 400.

In an embodiment, the first housing 110 may include a first surface 111 and a second surface 112 facing the first surface 111, and the second housing 120 may include a third surface 121 and a fourth surface 122 facing the third surface 121.

In an embodiment, the display 200 may be viewed from the outside through at least one surface of the foldable housing 100, and may extend from being on or above the first surface 111 of the first housing 110 to being on or above the third surface 121 of the second housing 120.

In an embodiment, the first housing 110 may include a first side surface 113 connected to the hinge structure 130 and parallel to the rotation axis (e.g., the rotation axis A of FIG. 2), a second side 114 facing the first side 113, and a third side 115 perpendicular to the rotation axis A of the hinge structure 130.

In an embodiment, the second housing 120 may include a fourth side 123 connected to the hinge structure 130 and parallel to the rotation axis (e.g., the rotation axis A of FIG. 2), a fifth side 124 facing the fourth side 123, and a sixth side 125 perpendicular to the rotation axis A of the hinge structure 130.

In an embodiment, the first housing 110 may include a first rotation support surface 116, and the second housing 120 may include a second rotation support surface 126 corresponding to the first rotation support surface 116. The first rotation support surface 116 and the second rotation support surface 126 may include curved surfaces corresponding to curved surfaces included in the hinge cover 131.

In an embodiment, when the electronic device 101 is unfolded (e.g., the electronic device 101 of FIG. 1), the hinge cover 131 may be covered so that the hinge cover 131 is not exposed to the rear surface of the electronic device 101 or may be minimally exposed. In another embodiment, when the electronic device 101 is folded into the state shown in FIG. 2, the first rotation support surface 116 and the second rotation support surface 126 may be rotated along a curved surface included in the hinge cover 131 so that the hinge cover 131 is maximally exposed to the rear surface.

Figure 4:
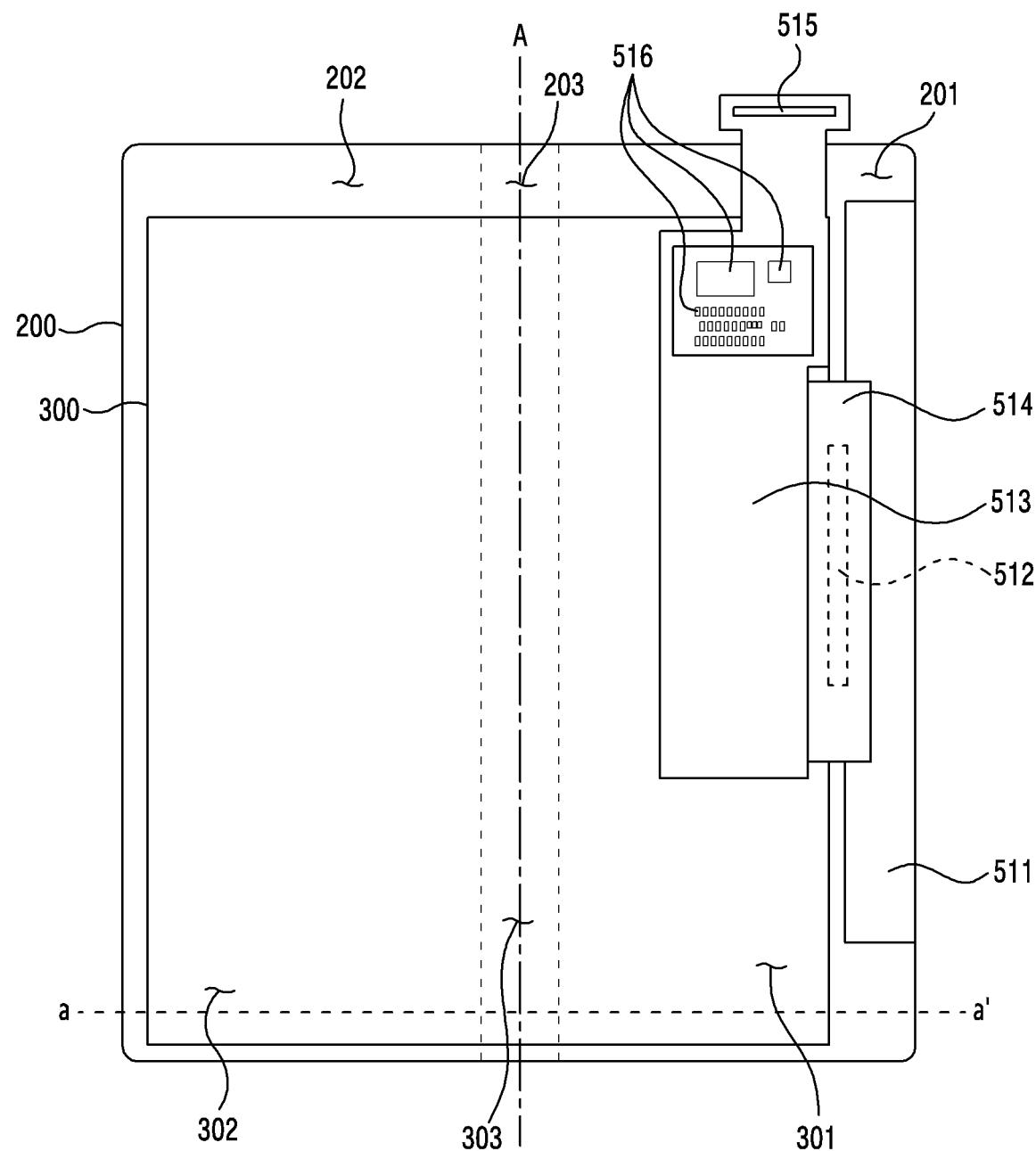
FIG. 4 illustrates a heat dissipation sheet and electronic components arranged on the rear surface of a flexible display according to an embodiment.

FIG. 4 illustrates a heat dissipation sheet 300 and electronic components arranged on the rear surface of a display 200 according to an embodiment.

Referring to FIG. 4, the heat dissipation sheet 300 may be arranged on the rear surface of the display 200. The heat dissipation sheet 300 may cover at least a portion of the display 200. At least one electronic component may be arranged at a position adjacent to the rear surface of the heat dissipation sheet 300.

In an embodiment, the heat dissipation sheet 300 may include, with respect to a third portion (or a bending portion) 303, a first portion 301 arranged on one side (e.g., on the right side of the third portion 303) and a second portion 302 arranged on the other side (e.g., the right side of the third part 303). However, the region division of the heat dissipation sheet 300 illustrated in FIG. 4 is exemplary, and may be divided into a plurality of regions according to the structure or function of the heat dissipation sheet 300.

In an embodiment, the first portion 301 and the second portion 302 of the heat dissipation sheet 300 may have generally symmetrical shapes with respect to the third portion 303. In an example, the third portion 303 of the heat dissipation sheet 300 may correspond to the folding region 203 of the display 200 (or the hinge structure 130 in FIG. 3).

In an embodiment, the third portion 303 may have a structure that is capable of compensating for change in length of the folding region 203 according to the folding operation or the unfolding operation of the first housing (e.g., the first housing 110 in FIG. 1) and the second housing (e.g., the second housing 120 in FIG. 1) via the hinge structure (e.g., the hinge structure 130 in FIG. 1). In one example, the third portion 303 may include a structure that protrudes or is folded one or more times to compensate for variable length in the folding region 203 of the display 200.

In one embodiment, the heat dissipation sheet 300 may have a layered structure including a plurality of layers. The structure of the heat dissipation sheet 300 will be described in detail with reference to FIGS. 5A to 7.

In an embodiment, the display 200 may include a planar portion corresponding to a flat portion, a curved portion 511 extending from the planar portion and bent to come into contact with the rear surface of the display 200, a connection pad 514 including an electrical wiring structure electrically connected to the curved portion 511 and including a control circuit 512, and a printed circuit board (PCB) 513 electrically connected to the connection pad 514. In an embodiment, the display 200 may include a flexible display that is foldable about the rotation axis A such that opposite portions with respect to the rotation axis A face each other.

In an embodiment, the control circuit 512 may include a display driver IC (DDI) and/or a touch display driver IC (TDDI) arranged on the connection pad 514 having electrical wiring structure. In an embodiment, the connection pad 514 may include a separate FPCB or film including the control circuit 512 arranged using chip-on-film (COF) implementation. In another example, the control circuit 512 may be arranged in using chip-on-panel (COP) implementation in which the control circuit 512 is arranged in the curved portion 511 without the connection pad 514.

In an embodiment, the PCB 513 may include an element arrangement region in which a plurality of elements 516 are arranged, and an electrical connector 515 arranged at an end portion of the PCB and electrically connected to a first main circuit (e.g., the first main circuit board 510) of the electronic device (e.g., the electronic device 101 of FIG. 1). The plurality of elements 516 may include passive elements such as a touch sensor IC, a flash memory for a display, and/or a diode for preventing Electro Static Discharge (ESD). In another example, when the curved portion 511, the connection pad 514, and the PCB 513 are arranged in a region of the display 200 that faces the second housing (e.g., the second housing 120 in FIG. 1), the electrical connector 515 may be electrically connected to a second main circuit board (e.g., the second main circuit board 520 in FIG. 3) of the electronic device (e.g., the electronic device 101 in FIG. 1).

In an embodiment, the control circuit 512, the PCB 513, the connection pad 514, and the plurality of elements 516 may generate a relatively large amount of heat, and thus may be understood as heat sources of the electronic device (e.g., the electronic device 101 of FIG. 1).

In an embodiment, the control circuit 512, the PCB 513, the connection pad 514, and the plurality of devices 516 may be arranged to be adjacent to at least a portion of the heat dissipation sheet 300. In an example, heat generated by the heat sources may be transferred to the heat dissipation sheet 300. The heat dissipation sheet 300 may diffuse the transferred heat to other regions of the electronic device (e.g., the electronic device 101 in FIG. 1), so as to diffuse the heat over the entire device.

Figure 5A:
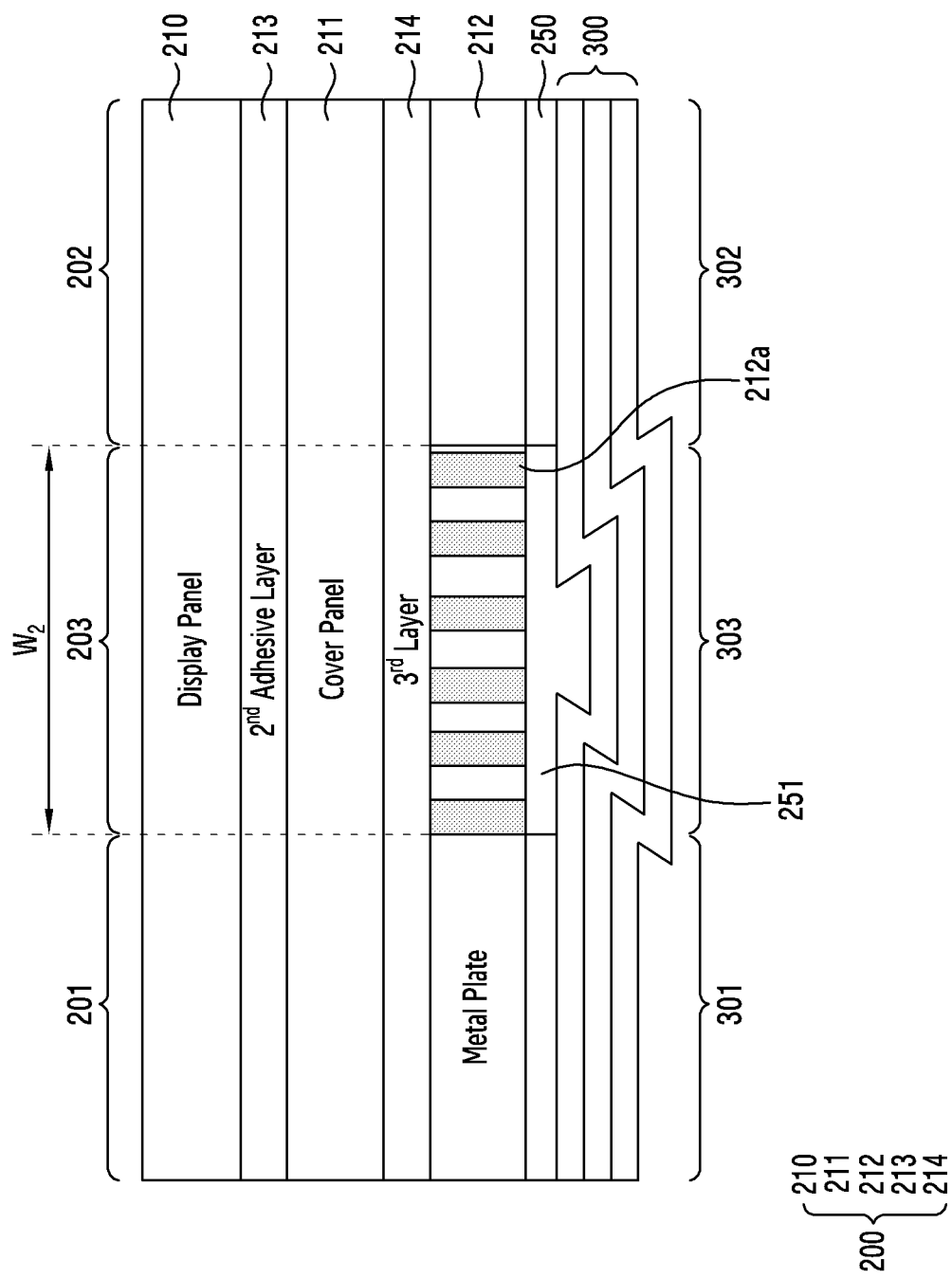
FIG. 5A illustrates a portion of a cross section taken along line a-a' of FIG. 4 in the unfolded state of the electronic device according to an embodiment.
Figure 5B:
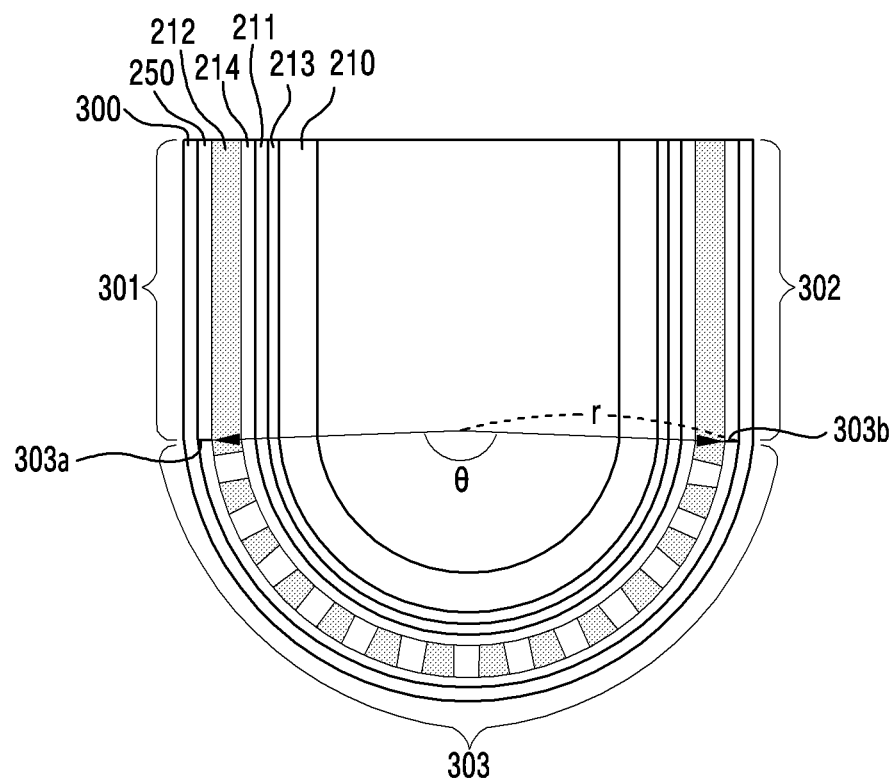
FIG. 5B illustrates a cross section taken along line a-a' of FIG. 4 in the folded state of the electronic device according to an embodiment.

FIG. 5A illustrates a portion of a cross section taken along line a-a' of FIG. 4 in the unfolded state of the electronic device according to an embodiment. FIG. 5B illustrates a cross section taken along line a-a' of FIG. 4 in the folded state of the electronic device according to an embodiment.

Referring to FIG. 5A, the cross section taken along line a-a' in FIG. 4 is partially illustrated in the unfolded status (e.g., FIG. 1) of the electronic device (e.g., the electronic device 101 in FIG. 1). In an example, the electronic device 101 may include a display 200, a first adhesive layer 250, and a heat dissipation sheet 300.

In an embodiment, the display 200 may include a display panel 210, a cover panel 211, a metal plate 212, a second adhesive layer 213, and a third adhesive layer 214.

In an embodiment, the display panel 210 may include a plurality of layers. In an example, the display panel 210 may include a cover window (e.g., polyimide (PI) film or ultra-thin glass (UTG)), a polarizer (POL) (e.g., polarizing film) arranged on the rear surface of the cover window, and a display panel (e.g., liquid crystal (LCD) panel or OLED panel), and/or a touch screen panel.

In an embodiment, a cover panel 211 may be arranged on the rear surface of the display panel 210. In an example, the cover panel 211 may be a back light unit.

In an embodiment, the second adhesive layer 213 may be bonded between the display panel 210 and the cover panel 211.

In an embodiment, the metal plate 212 may be arranged on the rear surface of the cover panel 211. In an example, the metal plate 212 may support the display panel 210 and the cover panel 211. In an example, the metal plate 212 is a flexible metal plate made of stainless steel (STS), and may be implemented as thin-film. In an embodiment, the metal plate 212 may be in the form of a metal sheet and may help to reinforce the rigidity of the display 200. In an example, the folding region 212a of the metal plate 212 may correspond to the folding region 203 of the display 200. The folding region 212a may include a first pattern corresponding to the folding region 203 of the display 200. In an example, the first pattern may include a plurality of openings (e.g., holes or recesses) arranged in parallel to a rotation axis (e.g., the rotation axis A in FIG. 1) and having a longitudinal direction along the rotation axis.

In an embodiment, the third adhesive layer 214 may be bonded between the cover panel 211 and the metal plate 212.

In an embodiment, the heat dissipation sheet 300 may be arranged on the rear surface of the display 200. In an example, the heat dissipation sheet 300 may be arranged on the rear surface of the metal plate 212 of the display 200.

In an embodiment, the heat dissipation sheet 300 may include a first portion 301 corresponding to the first housing 110 of the electronic device 101 and the first region 201 of the display 200, a second portion 302 corresponding to the second housing 120 or the second region 202 of the display 200, and a third portion 303 corresponding the hinge structure (e.g., the hinge structure 130 of FIG. 3) or the folding region 203 of the display 200.

In an embodiment, the third portion 303 of the heat dissipation sheet 300 may include various structures for compensating for a length varying according to the folding or unfolding operation of the electronic device 101. In an example, the third portion 303 may include a structure that protrudes or is folded one or more times (e.g. pleated) with respect to the first portion 301 and the second portion 302.

In an embodiment, the first adhesive layer 250 may be bonded between the metal plate 212 and the heat dissipation sheet 300.

In an embodiment, the first adhesive layer 250 may include a first opening 251 in a region corresponding to the third portion 303 of the heat dissipation sheet 300. In an example, at least a portion of the structure that protrudes or is folded one or more times and is included in the third portion 303 of the heat dissipation sheet 300 may be arranged in at least a portion in the first opening 251 of the first adhesive layer 250. Since at least a portion of the structure that protrudes or is folded one or more times in the third portion 303 of the heat dissipation sheet 300 may be arranged in the first opening 251 in the first adhesive layer 250, rather than being disposed in a separate space, it is possible to efficiently utilize the internal space of the electronic device 101.

In an embodiment, the first adhesive layer 250, the second adhesive layer 213, and the third adhesive layer 214 may include an adhesive material. For example, the adhesive material may include at least one of optical clear adhesive (OCA), pressure-sensitive adhesive (PSA), heat-responsive adhesive, general adhesive, or double-sided tape.

In an embodiment, the first opening 251 in the first adhesive layer 250 may be a portion from which at least a portion of the adhesive material is removed from a region corresponding to the third portion 303 of the heat dissipation sheet 300. For example, the first adhesive layer 250 may include an adhesive material in the region corresponding to the first portion 301 and the second portion 302 of the heat dissipation sheet 300 and may not include at least of the adhesive material in the region corresponding to the third portion of the heat dissipation sheet 300.

FIG. 5B illustrates a portion of the cross section taken along line a-a' in FIG. 4 in the fully folded state (e.g., FIG. 2) of the electronic device (e.g., the electronic device 101 in FIG. 1).

In an embodiment, referring to FIG. 5B, the electronic device 101 may be in the fully folded state in which the first housing 110 and the second housing 120 may face each other when they are rotated via the hinge structure 130 from the unfolded state.

In an embodiment, the third portion 303 of the heat dissipation sheet 300 may include a portion in which a bending moment is generated when the electronic device 101 is switched from the unfolded state of FIG. 1 to the folded state of FIG. 2.

In an embodiment, the third portion 303 of the heat dissipation sheet 300 may include a first end which is connected to the first portion 301 and at which a bending moment is generated and a second end which is connected to the second portion 302 and at which a bending moment is generated. In an example, an angle θ formed by the edge of the first end 303a and the second end 303b with respect to an imaginary axis when the electronic device 101 is fully folded may be referred to as a first arc center angle θ. In addition, the shortest distance from the center of the imaginary axis to the first end 303a or the second end 303b may be referred to as a first curvature radius r.

In an embodiment, the length of the third portion 303 of the heat dissipation sheet 300 may be the same as or substantially the same as the length of an arc formed by the structure that protrudes or is folded at least once. In an example, the length of the arc may be obtained using the first arc central angle θ and the first curvature radius r.

In an embodiment, the size of the first opening 251 in the first adhesive layer 250 may be about twice or more of the first curvature radius r.

Figure 6:
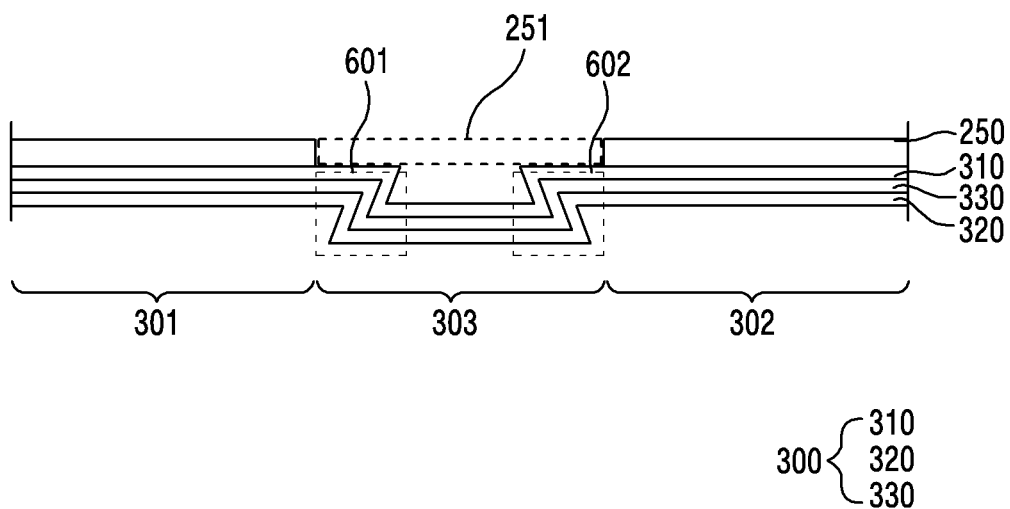
FIG. 6 illustrates a first adhesive layer and a heat dissipation sheet according to an embodiment.

FIG. 6 illustrates the first adhesive layer 250 and the heat dissipation sheet 300 according to an embodiment.

Referring to FIG. 6, the heat dissipation sheet 300 may have a layered structure including a plurality of layers. The heat dissipation sheet 300 may include a heat transfer sheet 330 (e.g., graphite sheet or copper (Cu) sheet) made of a material having a relatively high heat transfer rate and at least one protective sheet for maintaining the rigidity of the heat transfer sheet 330 and protecting the heat transfer sheet 330. The at least one protective sheet may be arranged above and below the heat transfer sheet 330. In an example, the heat transfer sheet 330 may be arranged between a first protective sheet 310 and a second protective sheet 320.

Referring to FIG. 6, the third portion 303 of the heat dissipation sheet 300 may include a structure that protrudes or is folded at least once with respect to the first portion 301 and the second portion 302 to compensate for a change in length of the heat dissipation sheet 300 according to a length change occurring in the folding region 203 of the display 200. In an example, the third portion 303 may include a first folded structure 601 arranged to overlap the first portion 301 and a second folded structure 602 arranged to overlap the second portion 302.

Figure 7:
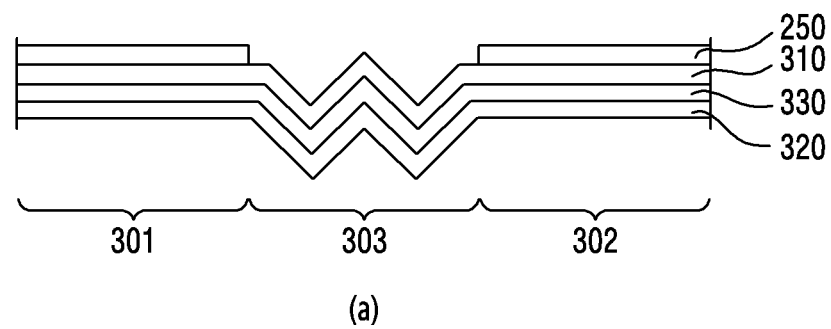
FIGS. 7A to 7C illustrates heat dissipation sheets including various structures according to various embodiments.
Figure 7:
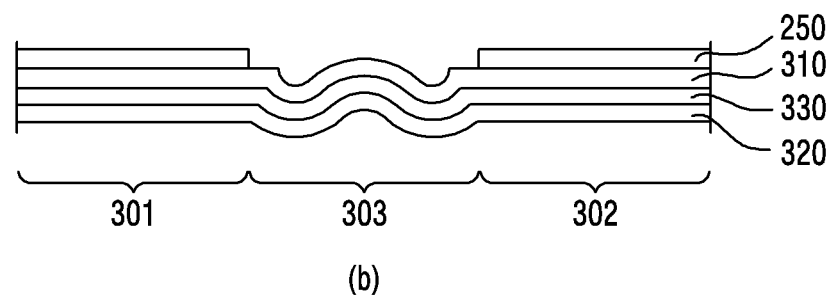
Figure 7:
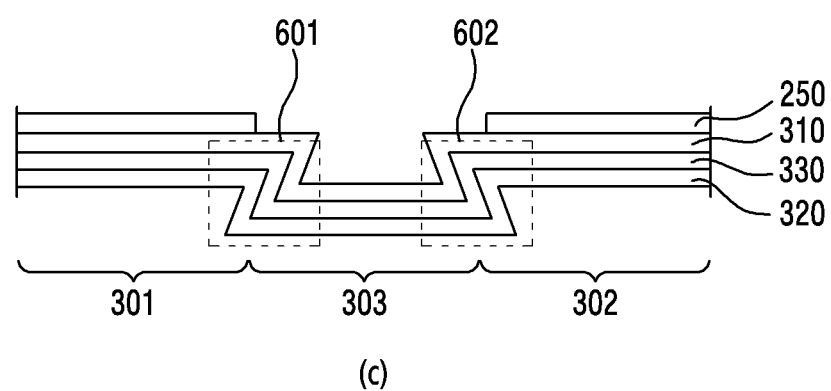

FIG. 7 illustrate heat dissipation sheets 300 including various structures according to various embodiments, respectively.

Referring to FIG. 7, the third portion 303 of the heat dissipation sheet 300 corresponding to the hinge structure 130 may include various structures.

Referring to FIG. 7, the third portion 303 may include a wrinkle portion.

Referring to part (a) of FIG. 7, the cross section of the wrinkle portion may include a plurality of folded structures. At least one of the plurality of folded structures may be arranged in at least a portion of the first opening 251 in the first adhesive layer 250.

Referring to part (b) of FIG. 7, in an embodiment, the third portion 303 may include a wrinkle portion, and the cross section of the wrinkle portion may include a structure having a plurality of semicircular shapes.

Referring to part (c) of FIG. 7, the third portion 303 may include a first folded structure 601 arranged to overlap the first portion 301 and a second folded structure 602 arranged to overlap the second portion 302.

Various structures of the third portion 303 are not limited to the above-described embodiments. For example, the third part 303 may include a structure corresponding to a combination of the above-described embodiments.

Figure 8A:
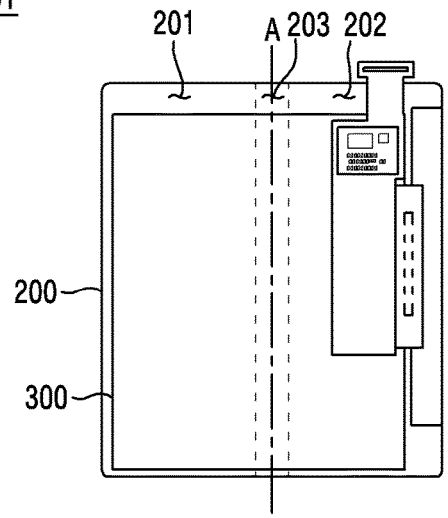
FIG. 8A is views illustrating a heat generation test result of an electronic device including an integrated heat dissipation sheet according to an embodiment.
Figure 8A:
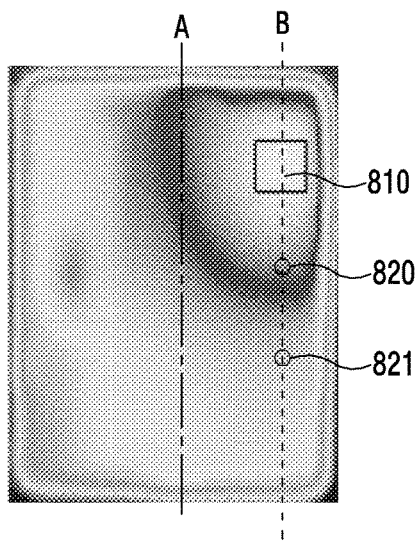
Figure 8A:
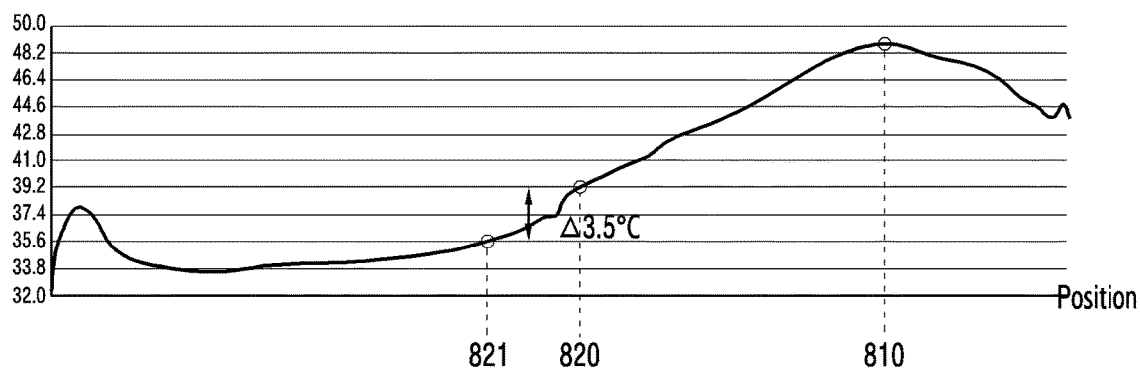
Figure 8B:
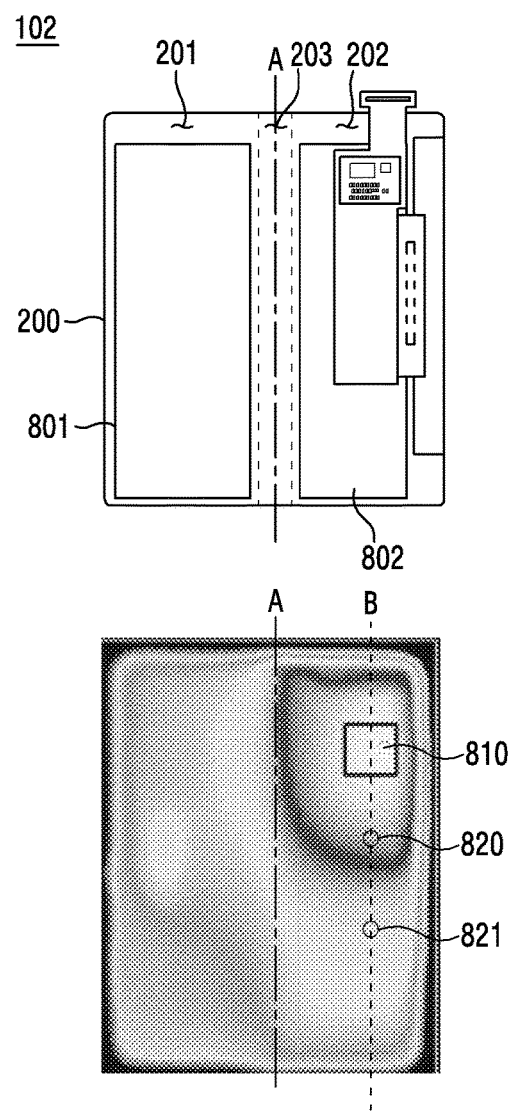
FIG. 8B illustrates a heat test result of an electronic device including separated heat dissipation sheets according to an embodiment.
Figure 8B:
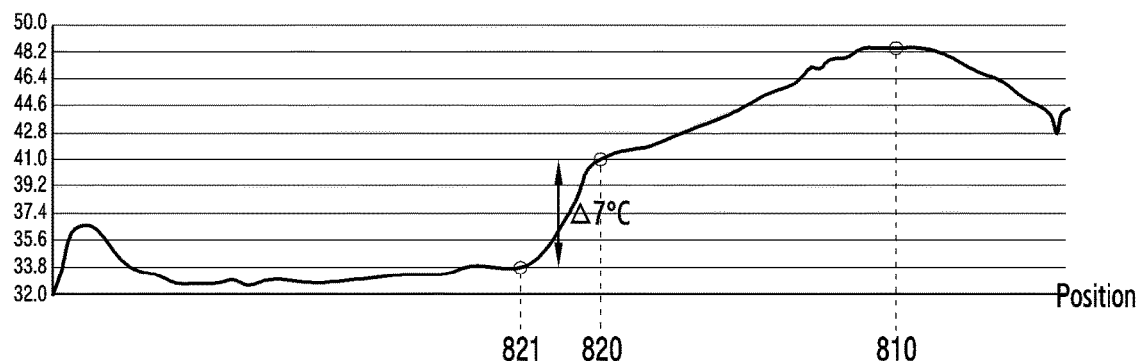

FIG. 8A is views illustrating a heat generation test result of an electronic device 101 including an integrated heat dissipation sheet 300 according to an embodiment. FIG. 8B is views illustrating a heat generation test result of an electronic device 102 including separated heat dissipation sheets 801 and 802 according to an embodiment.

Referring to FIGS. 8A and 8B, the electronic device 101 may include a heat dissipation sheet 300 arranged on the rear surface of the display 200. The electronic device 102 may include a heat dissipation sheet 801 arranged in the first region 201 of the display 200 and a heat dissipation sheet 802 arranged in the second region 202 of the display 200. In an example, the electronic device 101 may include the integrated heat dissipation sheet 300. The electronic device 102 may include the separated heat dissipation sheets 801 and 802. Hereinafter, it is assumed that the electronic device 101 and the electronic device 102 are the same as each other in the other components and structures, other than the arrangements of the heat dissipation sheets.

In an embodiment, main heat sources 810 of the electronic device 101 and the main heat source 810 (e.g., the control circuit 512, the PCB 513, the connection pad 514, or a plurality of elements 516 in FIG. 4) included in the electronic device 101 and the electronic device 102 may be the same. Hereinafter, it is assumed that the electronic device 101 and the electronic device 102 have the same amount of heat generated from the main heat sources.

Referring to FIGS. 8A and 8B, in the case of the electronic device 101, the difference between the temperature at a first position 820 spaced apart from a main heat source 810 by a first distance on an axis B parallel to the rotation axis A and the temperature at a second position spaced apart from the main heat source 810 by a second distance on the axis B may be about 3.5° C. In the case of the electronic device 102, the difference between the temperature at the first position 820 spaced apart from a main heat source 810 by the first distance on an axis B parallel to the rotation axis A and the temperature at the second position spaced apart from the main heat source 810 by the second distance on the axis B may be about 7° C. Since the electronic device 101 includes the integrated heat dissipation sheet 300, the heat generated by the heat source 810 is diffused more efficiently to the rest of the electronic device 101. Thus, the difference between the temperature at the first position 820 and the temperature at the second position 821 in the electronic device 101 may be relatively small. When the electronic device 102 includes separated heat dissipation sheets 801 and 802 in which the heat generated by the heat source 810 dissipates through the heat dissipation sheet 802, no heat dissipation sheet is arranged in a region corresponding to the hinge structure 130 and thus heat diffusion is not performed relatively smoothly. Thus, the difference between the temperature at the first position 820 and the temperature at the second position 821 of the electronic device 102 may be relatively large. Accordingly, the electronic device 101 including the integrated heat dissipation sheet 300 may be better in heat dissipation than the electronic device 102 including the separated heat dissipation sheets 801 and 802.

Figure 9:
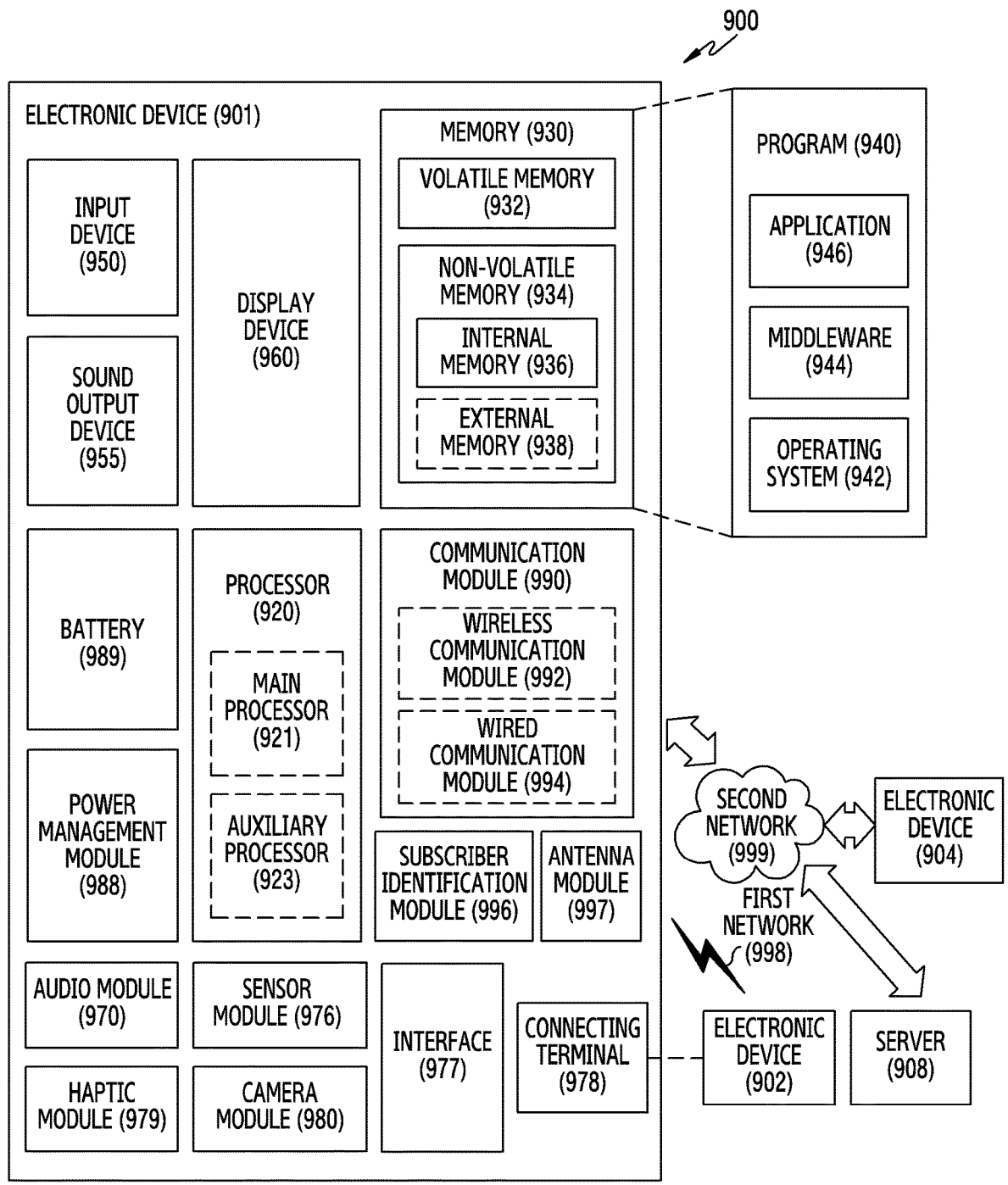
FIG. 9 is a view illustrating a network environment that includes an electronic device according to various embodiments.

FIG. 9 is a block diagram illustrating an electronic device 901 in a network environment 900 according to various embodiments.

Referring to FIG. 9, the electronic device 901 in the network environment 900 may communicate with an electronic device 902 via a first network 998 (e.g., a short-range wireless communication network), or at least one of an electronic device 904 or a server 908 via a second network 999 (e.g., a long-range wireless communication network). According to an embodiment, the electronic device 901 may communicate with the electronic device 904 via the server 908. According to an embodiment, the electronic device 901 may include a processor 920, memory 930, an input module 950, a sound output module 955, a display module 960, an audio module 970, a sensor module 976, an interface 977, a connecting terminal 978, a haptic module 979, a camera module 980, a power management module 988, a battery 989, a communication module 990, a subscriber identification module (SIM) 996, or an antenna module 997. In some embodiments, at least one of the components (e.g., the connecting terminal 978) may be omitted from the electronic device 901, or one or more other components may be added in the electronic device 901. In some embodiments, some of the components (e.g., the sensor module 976, the camera module 980, or the antenna module 997) may be implemented as a single component (e.g., the display module 960).

The processor 920 may execute, for example, software (e.g., a program 940) to control at least one other component (e.g., a hardware or software component) of the electronic device 901 coupled with the processor 920, and may perform various data processing or computation. According to one embodiment, as at least part of the data processing or computation, the processor 920 may store a command or data received from another component (e.g., the sensor module 976 or the communication module 990) in volatile memory 932, process the command or the data stored in the volatile memory 932, and store resulting data in non-volatile memory 934. According to an embodiment, the processor 920 may include a main processor 921 (e.g., a central processing unit (CPU) or an application processor (AP)), or an auxiliary processor 923 (e.g., a graphics processing unit (GPU), a neural processing unit (NPU), an image signal processor (ISP), a sensor hub processor, or a communication processor (CP)) that is operable independently from, or in conjunction with, the main processor 921. For example, when the electronic device 901 includes the main processor 921 and the auxiliary processor 923, the auxiliary processor 923 may be adapted to consume less power than the main processor 921, or to be specific to a specified function. The auxiliary processor 923 may be implemented as separate from, or as part of the main processor 921.

The auxiliary processor 923 may control at least some of functions or states related to at least one component (e.g., the display module 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to an embodiment, the auxiliary processor 923 (e.g., an image signal processor or a communication processor) may be implemented as part of another component (e.g., the camera module 980 or the communication module 990) functionally related to the auxiliary processor 923. According to an embodiment, the auxiliary processor 923 (e.g., the neural processing unit) may include a hardware structure specified for artificial intelligence model processing. An artificial intelligence model may be generated by machine learning. Such learning may be performed, e.g., by the electronic device 901 where the artificial intelligence is performed or via a separate server (e.g., the server 908). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 930 may store various data used by at least one component (e.g., the processor 920 or the sensor module 976) of the electronic device 901. The various data may include, for example, software (e.g., the program 940) and input data or output data for a command related thereto. The memory 930 may include the volatile memory 932 or the non-volatile memory 934.

The program 940 may be stored in the memory 930 as software, and may include, for example, an operating system (OS) 942, middleware 944, or an application 946.

The input module 950 may receive a command or data to be used by another component (e.g., the processor 920) of the electronic device 901, from the outside (e.g., a user) of the electronic device 901. The input module 950 may include, for example, a microphone, a mouse, a keyboard, a key (e.g., a button), or a digital pen (e.g., a stylus pen).

The sound output module 955 may output sound signals to the outside of the electronic device 901. The sound output module 955 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 960 may visually provide information to the outside (e.g., a user) of the electronic device 901. The display module 960 may include, for example, a display, a hologram device, or a projector and control circuitry to control a corresponding one of the display, hologram device, and projector. According to an embodiment, the display module 960 may include a touch sensor adapted to detect a touch, or a pressure sensor adapted to measure the intensity of force incurred by the touch.

The audio module 970 may convert a sound into an electrical signal and vice versa. According to an embodiment, the audio module 970 may obtain the sound via the input module 950, or output the sound via the sound output module 955 or a headphone of an external electronic device (e.g., an electronic device 902) directly (e.g., wiredly) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to an embodiment, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly (e.g., wiredly) or wirelessly. According to an embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to an embodiment, the connecting terminal 978 may include, for example, a HDMI connector, a USB connector, a SD card connector, or an audio connector (e.g., a headphone connector).

The haptic module 979 may convert an electrical signal into a mechanical stimulus (e.g., a vibration or a movement) or electrical stimulus which may be recognized by a user via his tactile sensation or kinesthetic sensation. According to an embodiment, the haptic module 979 may include, for example, a motor, a piezoelectric element, or an electric stimulator.

The camera module 980 may capture a still image or moving images. According to an embodiment, the camera module 980 may include one or more lenses, image sensors, image signal processors, or flashes.

The power management module 988 may manage power supplied to the electronic device 901. According to one embodiment, the power management module 988 may be implemented as at least part of, for example, a power management integrated circuit (PMIC).

The battery 989 may supply power to at least one component of the electronic device 901. According to an embodiment, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the application processor (AP)) and supports a direct (e.g., wired) communication or a wireless communication. According to an embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or infrared data association (IrDA)) or the second network 999 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The wireless communication module 992 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 992 may support a high-frequency band (e.g., the mmWave band) to achieve, e.g., a high data transmission rate. The wireless communication module 992 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 992 may support various requirements specified in the electronic device 901, an external electronic device (e.g., the electronic device 904), or a network system (e.g., the second network 999). According to an embodiment, the wireless communication module 992 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 997 may transmit or receive a signal or power to or from the outside (e.g., the external electronic device) of the electronic device 901. According to an embodiment, the antenna module 997 may include an antenna including a radiating element composed of a conductive material or a conductive pattern formed in or on a substrate (e.g., a printed circuit board (PCB)). According to an embodiment, the antenna module 997 may include a plurality of antennas (e.g., array antennas). In such a case, at least one antenna appropriate for a communication scheme used in the communication network, such as the first network 998 or the second network 999, may be selected, for example, by the communication module 990 (e.g., the wireless communication module 992) from the plurality of antennas. The signal or the power may then be transmitted or received between the communication module 990 and the external electronic device via the selected at least one antenna. According to an embodiment, another component (e.g., a radio frequency integrated circuit (RFIC)) other than the radiating element may be additionally formed as part of the antenna module 997.

According to various embodiments, the antenna module 997 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 901 and the external electronic device 904 via the server 908 coupled with the second network 999. Each of the electronic devices 902 or 904 may be a device of a same type as, or a different type, from the electronic device 901. According to an embodiment, all or some of operations to be executed at the electronic device 901 may be executed at one or more of the external electronic devices 902, 904, or 908. For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, mobile edge computing (MEC), or client-server computing technology may be used, for example. The electronic device 901 may provide ultra low-latency services using, e.g., distributed computing or mobile edge computing. In another embodiment, the external electronic device 904 may include an internet-of-things (IoT) device. The server 908 may be an intelligent server using machine learning and/or a neural network. According to an embodiment, the external electronic device 904 or the server 908 may be included in the second network 999. The electronic device 901 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, an electronic device may include a first housing, a second housing connected to the first housing via a hinge structure to be rotatable relative to the first housing, an electronic component arranged in at least one region of the first housing or the second housing, a flexible display arranged in one region of the first housing and one region of the second housing, the flexible display being configured to be foldable according to rotation, a heat dissipation sheet arranged under the flexible display and configured to diffuse heat generated by the electronic component, and a first adhesive layer configured to bond the flexible display and the heat dissipation sheet to each other. The heat dissipation sheet may include a first portion corresponding to the first housing, a second portion corresponding to the second housing, and a third portion interconnecting the first portion and the second portion and corresponding to the hinge structure. The third portion may include a structure that protrudes or is folded at least once with respect to the first portion and the second portion. The first adhesive layer may include a first opening in the region corresponding to the third portion.

According to an embodiment, the flexible display may include a display panel, a cover panel, and a metal plate, and the heat dissipation sheet may be arranged on the rear surface of the metal plate.

According to an embodiment, the metal plate may include a first pattern in a portion corresponding to the hinge structure.

According to an embodiment, a first support plate arranged in a region corresponding to the first housing on a rear surface of the heat dissipation sheet, and a second support plate arranged in a region corresponding to the second housing on the rear surface of the heat dissipation sheet may be included.

According to an embodiment, the electronic component may be arranged on the rear surface of the flexible display.

According to an embodiment, the electronic component may include a display driver IC (DDI) or a touch display driver IC (TDDI) configured to control the flexible display.

According to an embodiment, the electronic component may include at least one of a control circuit, a printed circuit board, or a connection pad.

According to an embodiment, the heat dissipation sheet may include a first protective sheet, a second protective sheet, and a graphite sheet arranged between the first protective sheet and the second protective sheet.

According to an embodiment, the third portion of the heat dissipation sheet may include a wrinkle portion, and the cross section of the wrinkle portion may have a plurality of semicircular shapes.

According to an embodiment, the third portion of the heat dissipation sheet may include a first folded structure arranged to overlap the first portion and a second folding structure arranged to overlap the second portion.

According to an embodiment, at least a portion of the structure that protrudes or is folded at least once in the third portion of the heat dissipation sheet may be arranged in at least a portion of the first opening in the first adhesive layer.

According to an embodiment, when the electronic device is fully folded, the third portion of the heat dissipation sheet may have a length correspond to the length of an arc formed when the structure that protrudes or is folded at least once is fully folded.

According to an embodiment, when the electronic device is fully folded, the first housing and the second housing may face each other, and when the electronic device is fully unfolded, the first housing and the second housing may be at an angle of 180 degrees.

According to an embodiment, the third portion of the heat dissipation sheet includes a first end connected to the first portion and a second end connected to the second portion. When the electronic device is fully folded, the first end and the second end with respect to an imaginary axis may form a first arc center angle, a shortest length from the first end or the second end to the imaginary axis may be a first curvature radius, and a length of the third portion may be an arc length obtained using the first arc center angle and the first curvature radius.

According to an embodiment, the first opening may have a horizontal length corresponding to at least twice the first curvature radius.

An electronic device according to various embodiments of the disclosure may include a hinge structure extending in a rotation axis direction, a first housing connected to one side of the hinge structure in a direction perpendicular to the rotation axis of the hinge structure to rotate about the rotation axis relate to the hinge structure, a second housing connected to the other side of the hinge structure to rotate about the rotation axis relative to the hinge structure, an electronic component arranged in at least one region of the first housing or the second housing, a flexible display disposed on one region of the first housing and one region of the second housing, the flexible display being configured to be foldable according to rotation, a heat dissipation sheet arranged under the flexible display and configured to diffuse heat generated by the electronic component, and a first adhesive layer configured to bond the flexible display and the heat dissipation sheet to each other. The heat dissipation sheet may include a bending region at least a portion of which is arranged to correspond to the hinge structure and formed as a flat or curved surface, a first portion extending from the bending region to one side in a direction perpendicular to the rotation axis, and a second portion extending from the bending region to the other side in the direction perpendicular to the rotation axis. The bending region may include a structure that protrudes or is folded at least once with respect to the first portion and the second portion, and the first adhesive layer may include a portion that does not include an adhesive material in a region corresponding to the bending region.

According to an embodiment, the heat dissipation sheet may include a first protective sheet, a second protective sheet, and a graphite sheet arranged between the first protective sheet and the second protective sheet.

According to an embodiment, the bending region of the heat dissipation sheet may include a wrinkle portion, and the cross section of the wrinkle portion may have a plurality of semicircular shapes.

According to an embodiment, at least a portion of the structure that protrudes or is folded at least once in the bending region of the heat dissipation sheet may be arranged in the portion of the first adhesive layer that does not include the adhesive material.

According to an embodiment, when the electronic device is fully folded, the bending region of the heat dissipation sheet may have a length corresponding to the length of an arc formed when the structure that protrudes or is folded at least once is fully folded.

While the present disclosure has been shown and described with reference to various embodiments thereof, it will be understood by those skilled in the art that various changes in form and details may be made therein without departing from the present disclosure as defined by the appended claims and their equivalents.

The invention claimed is:
1. An electronic device comprising:
a first housing;
a second housing connected to the first housing via a hinge structure to be rotatable relative to the first housing;
an electronic component arranged in at least one region of the first housing or the second housing;
a flexible display arranged in one region of the first housing and one region of the second housing, the flexible display being configured to be foldable according to rotation;
a heat dissipation sheet arranged under the flexible display and configured to diffuse heat generated by the electronic component; and
a first adhesive layer configured to bond the flexible display and the heat dissipation sheet to each other,
wherein the heat dissipation sheet includes a first portion corresponding to the first housing, a second portion corresponding to the second housing, and a third portion interconnecting the first portion and the second portion and corresponding to the hinge structure,
wherein the third portion includes a structure that protrudes or is folded at least once with respect to the first portion and the second portion, and
wherein the first adhesive layer includes a first opening in a region corresponding to the third portion.
2. The electronic device of claim 1, wherein the flexible display includes a display panel, a cover panel, and a metal plate, and the heat dissipation sheet is arranged on a rear surface of the metal plate.

3. The electronic device of claim 2, wherein the metal plate includes a first pattern in a portion corresponding to the hinge structure.

4. The electronic device of claim 1, further comprising:
a first support plate arranged in a region corresponding to the first housing on a rear surface of the heat dissipation sheet; and
a second support plate arranged in a region corresponding to the second housing on the rear surface of the heat dissipation sheet.

5. The electronic device of claim 1, wherein the electronic component is arranged on a rear surface of the flexible display.

6. The electronic device of claim 1, wherein the electronic component includes a display driver IC (DDI) or a touch display driver IC (TDDI) configured to control the flexible display.

7. The electronic device of claim 1, wherein the electronic component includes at least one of a control circuit, a printed circuit board, or a connection pad.

8. The electronic device of claim 1, wherein the heat dissipation sheet includes a first protective sheet, a second protective sheet, and a graphite sheet arranged between the first protective sheet and the second protective sheet.

9. The electronic device of claim 1, wherein the third portion of the heat dissipation sheet includes a wrinkle portion, and a cross section of the wrinkle portion has a plurality of semicircular shapes.

10. The electronic device of claim 1, wherein the third portion of the heat dissipation sheet includes a first folded structure arranged to overlap the first portion and a second folding structure arranged to overlap the second portion.

11. The electronic device of claim 1, wherein at least a portion of the structure that protrudes or is folded at least once in the third portion of the heat dissipation sheet is arranged in at least a portion of the first opening in the first adhesive layer.

12. The electronic device of claim 1, wherein, when the electronic device is fully folded, the third portion of the heat dissipation sheet has a length corresponding to a length of an arc formed when the structure that protrudes or is folded at least once is fully folded.

13. The electronic device of claim 1, wherein, when the electronic device is fully folded, the first housing and the second housing face each other, and when the electronic device is fully unfolded, the first housing and the second housing are at an angle of 180 degrees.

14. The electronic device of claim 13, wherein the third portion of the heat dissipation sheet includes a first end connected to the first portion and a second end connected to the second portion, and
wherein, when the electronic device is fully folded, the first end and the second end with respect to an imaginary axis forms a first arc center angle, a shortest length from the first end or the second end to the imaginary axis is a first curvature radius, and a length of the third portion is an arc length obtained using the first arc center angle and the first curvature radius.

15. The electronic device of claim 14, wherein the first opening has a horizontal length corresponding to at least twice the first curvature radius.

16. An electronic device comprising:
a hinge structure extending in a rotation axis direction;
a first housing connected to one side of the hinge structure in a direction perpendicular to the rotation axis of the hinge structure to rotate about the rotation axis relative to the hinge structure;
a second housing connected to another side of the rotation axis of the hinge structure to rotate about the rotation axis relative to the hinge structure;
an electronic component arranged in at least one region of the first housing or the second housing;
a flexible display arranged from one region of the first housing to one region of the second housing, the flexible display being configured to be foldable according to rotation;
a heat dissipation sheet arranged under the flexible display and configured to diffuse heat generated by the electronic component; and
a first adhesive layer configured to bond the flexible display and the heat dissipation sheet to each other,
wherein the heat dissipation sheet includes a bending region at least a portion of which is arranged to correspond to the hinge structure and formed as a flat or curved surface, a first portion extending from the bending region to one side in a direction perpendicular to the rotation axis, and a second portion extending from the bending region to the other side in the direction perpendicular to the rotation axis,
wherein the bending region includes a structure that protrudes or is folded at least once with respect to the first portion and the second portion, and
wherein the first adhesive layer includes a portion that does not include an adhesive material in a region corresponding to the bending region.

17. The electronic device of claim 16, wherein the heat dissipation sheet includes a first protective sheet, a second protective sheet, and a graphite sheet arranged between the first protective sheet and the second protective sheet.

18. The electronic device of claim 16, wherein the bending region of the heat dissipation sheet includes a wrinkle portion, and a cross section of the wrinkle portion has a plurality of semicircular shapes.

19. The electronic device of claim 16, wherein at least a portion of the structure that protrudes or is folded at least once in the bending region of the heat dissipation sheet is arranged in the portion of the first adhesive layer that does not include the adhesive material.

20. The electronic device of claim 16, wherein, when the electronic device is fully folded, the bending region of the heat dissipation sheet has a length corresponding to a length of an arc formed when the structure that protrudes or is folded at least once is fully folded.

* * * * *